United States Patent [19]

Yamanouchi et al.

[11] Patent Number: 5,294,859
[45] Date of Patent: Mar. 15, 1994

[54] SURFACE ACOUSTIC WAVE FILTER DEVICE

[75] Inventors: Kazuhiko Yamanouchi, 37-13, Matsugaoka, Sendai, City, Miyagi Pref.; Mitsuhiro Tanaka, Chita; Masahiko Sugiyama, Nagoya; Yasufumi Horio, Nagoya; Masatsugu Oshima, Nagoya; Kenji Suzuki, Nagoya, all of Japan

[73] Assignees: Kazuhiko Yamanouchi; NGK Insulators, Ltd., Japan

[21] Appl. No.: 37,106

[22] Filed: Mar. 26, 1993

[30] Foreign Application Priority Data

Mar. 26, 1992 [JP] Japan .................................. 4-068233
Mar. 5, 1993 [JP] Japan .................................. 5-045368

[51] Int. Cl.⁵ ............................................. H01L 41/08
[52] U.S. Cl. ............................ 310/313 B; 310/313 D; 333/154
[58] Field of Search ............ 310/313 R, 313 B, 313 C, 310/313 D; 333/150, 151, 153, 154, 193, 195

[56] References Cited

U.S. PATENT DOCUMENTS 4,464,597 8/1984 Setsune .............................. 310/313 B
4,516,093 5/1985 Nyffler ......................... 310/313 B X
4,736,172 4/1988 Ebneter ................................. 333/193
5,065,065 11/1991 Hikita ............................... 310/313 B
5,087,901 2/1992 Kurosawa et al. ................... 333/193

FOREIGN PATENT DOCUMENTS

56-16313 2/1981 Japan .
3-20929 3/1991 Japan .

Primary Examiner—Mark O. Budd
Attorney, Agent, or Firm—Parkhurst, Wendel & Rossi

[57] ABSTRACT

A surface acoustic wave filter device includes a substrate which comprises quartz or the like piezoelectric having a small temperature coefficient and which is formed with unidirectional transducers of asymmetrical construction. A floating electrode is spaced from intermediate position between adjacent positive and negative electrodes which are arranged in interdigital manner, to effectively utilize a mechanical reflection caused by the floating electrode. In consideration of the sign and magnitude of the reflection factor of the floating electrodes, short-circuited electrodes only are used for the floating electrodes. The surface acoustic wave filter device has improved temperature characteristic, insertion loss characteristic and phase characteristic.

9 Claims, 6 Drawing Sheets

SURFACE ACOUSTIC WAVE FILTER DEVICE

BACKGROUND OF THE INVENTION

1. Field of the Invention

The present invention relates to a surface acoustic wave (SAW) filter device which may be used to take out a signal within a particular frequency band. More specifically, the invention pertains to a surface acoustic wave filter device having highly improved functional characteristics, e.g., temperature characteristic, insertion loss characteristic, phase characteristic, etc.

2. Description of the Prior Art

Conventionally, there is known a surface acoustic wave filter device which includes a piezoelectric substrate having a surface which is formed with interdigital-type transducers (IDT) on input and output sides. Such a surface acoustic wave filter device typically incorporates unidirectional transducers as the IDT's on the input and output sides, thereby to minimize the insertion loss of the device.

This type of unidirectional transducer is disclosed in for examples, JP-B-3-20929, and includes a piezoelectric substrate which comprises a LiNbO$_3$ monolithic body having a high electromechanical coupling factor, and positive and negative electrodes formed on the substrate and arranged in an interdigital manner. The electrode fingers of the positive and negative electrodes, i.e., those regions of the electrodes which are in overlapping relationship with each other when observed in the propagation direction of the surface acoustic wave, are spaced from each other by a center distance of $\lambda/2$ wherein $\lambda$ is the wavelength of a fundamental surface acoustic wave. Further, floating electrodes are formed between adjacent positive and negative electrodes and maintained in electrically floated state. As measured in the propagation direction of the surface acoustic wave, each of the electrode fingers of the positive and negative electrodes and the floating electrodes has a width of $\lambda/8$, and the center distance "d" between each floating electrode and an adjacent positive or negative electrode is set to satisfy the condition $\lambda/8 < d < \lambda/4$.

Furthermore, another type of surface acoustic wave filter device is disclosed in JP-A-3-133209, which also uses LiNbO$_3$ as the piezoelectric substrate, and which is formed as a wide band filter device. In this instance, the LiNbO$_3$ substrate is formed with positive and negative electrodes, and open-type floating electrodes and short-circuited floating electrodes both of which are arranged between the positive and negative electrodes. The width of the electrode finger of each electrode is set at $\lambda/12$, and the floating electrodes of both types are arranged at equal intervals of $\lambda/6$ between the positive and negative electrodes.

The surface acoustic wave filter device described above proved to be highly useful due to a relatively small insertion loss, and phase- and frequency-characteristics which can be suitably controlled. On the other hand, as a result of recent progressive development of digital communication systems, there arose a strong demand in the marketplace for surface acoustic wave filter devices having a narrow band characteristic with a low insertion loss. The narrow band characteristic of the filter device requires a stable pass band characteristic with a smaller variation of the pass band for temperature change. Such variation of the pass band is generally not a detrimental problem in the case of wide band filter devices because, even when the pass band is varied with the temperature change, the variation rate of the pass band relative to the entire band width is less significant as the pass band width itself is wide. However, in the case of narrow band filter devices, the pass band width itself is narrow and the variation rate of the pass band width relative to the pass band width is more significant, such that the predetermined center frequency tends to be readily excluded out of the pass band even with a slight temperature change. It is therefore highly desirable for the narrow band filter devices for digital communication systems to have a stable pass band characteristic for the temperature change.

In the surface acoustic wave filter device in which unidirectional transducers are formed on the LiNbO$_3$ substrate, a higher electromechanical coupling factor of the LiNbO$_3$ substrate makes it possible to lower the insertion loss of the device. However, an actual situation is that, due to larger pass band variation and band width fluctuation as a result of temperature change, the prior art surface acoustic wave filter device cannot be practically used for the narrow band filter device as it is.

SUMMARY OF THE INVENTION

Therefore, it is an object of the invention to provide a surface acoustic wave filter device having a smaller variation rate of band width for temperature change and yet a reduced insertion loss.

The present invention provides a novel surface acoustic wave filter device which comprises a substrate of a piezoelectric material. An interdigital-type input side transducer is applied on the surface of substrate and includes an input side positive electrode having a plurality of electrode fingers, an input side negative electrode having a plurality of electrode fingers each arranged between successive electrode fingers of the input side positive electrode, and an input side floating electrode having a plurality of electrode fingers arranged between successive electrode fingers of the input side negative and positive electrodes. An interdigital-type output side transducer is similarly applied on the surface of substrate and includes an output side positive electrode having a plurality of electrode fingers, an output side negative electrode having a plurality of electrode fingers each arranged between successive electrode fingers of the output side positive electrode, and an input side floating electrode having a plurality of electrode fingers arranged between successive electrode fingers of the output side negative and positive electrodes. The electrode fingers of positive and negative electrodes of each of the input side and output side transducers are spaced from each other by a center distance of $\lambda/2$ in a propagation direction of a surface acoustic wave which propagates on the surface of substrate, where $\lambda$ is a wavelength of a fundamental surface acoustic wave.

According to the present invention, furthermore, the piezoelectric material comprises a quartz or a material having an electromechanical coupling factor which is substantially on the same order as an electromechanical coupling factor of the quartz. The floating electrodes of the input side and output side transducers are short-circuited floating electrodes. Each electrode finger of the positive electrodes, negative electrodes and floating electrodes of each of the input side and output side transducers has a width "d" as defined in the propagation direction of the surface acoustic wave, and the width "d" satisfies a condition:

$0.8 \times \lambda/12 \leq d \leq 1.3 \times \lambda/12$.

Each electrode finger of the floating electrode of the input side transducer has an edge on its propagation direction-side of the surface acoustic wave, and the edge is spaced from an intermediate position between an adjacent electrode finger of positive electrode and an adjacent electrode finger of negative electrode, in a direction which is opposite to the propagation direction of the surface acoustic wave. Similarly, each electrode finger of the floating electrode of the output side transducer has an edge on its side opposite to the propagation direction of the surface acoustic wave, and the edge is spaced from an intermediate position between an adjacent electrode finger of positive electrode and an adjacent electrode finger of negative electrode, in the propagation direction of the surface acoustic wave.

The inventors conducted various experiments and analysis with respect to the variation of the pass band due to the temperature change, and found that it is most intensively affected by a temperature characteristic of the substrate. That is, a 128° rotated Y-cut, X-directional propagation-type LiNbO$_3$ substrate, which has been widely used for the prior art surface acoustic wave filter devices, possesses on one hand a high electromechanical coupling factor, but has a temperature coefficient to frequency (TCF), on the other hand, which is as high as −74 ppm/°C. within a temperature range of from −20° C. to 80° C., and which thus results in the drawback of a significant variation of the pass band width for the temperature variation. For this reason, according to the invention, quartz or the like material having a smaller TCF is used as the piezoelectric substrate material. For example, ST-cut quartz has TCF of as extremely small as 1.6 ppm/°C. within the temperature range of from −20° C. to 80° C., and thus makes it readily possible to realize the filter device having an extremely small variation of the pass band with temperature change.

On the other hand, the piezoelectric substrate material, such as quartz, as used in the present invention has a smaller electromechanical coupling factor in spite of its smaller TCF, so that the insertion loss would be too large for practical use if known unidirectional transducers were applied to the substrate in a conventional manner. Therefore, the present invention is to form unidirectional transducers in conformity with the characteristic of the substrate material having a smaller electromechanical coupling factor. Since the substrate material with a smaller electromechanical coupling factor is used in accordance with the present invention, a mechanical perturbed effect of the floating electrode is more effectively utilized because an electric perturbed effect is not expected. Moreover, as for the arrangement and positioning of the floating electrodes, an asymmetrical construction is enhanced to improve further the unidirectivity of the transducers.

In the unidirectional transducers disclosed in the above-mentioned JP-B-3-20929, the electrode width of the positive and negative electrodes is set to $\lambda/8$ and the electrode width "d" of the floating electrodes is set to $\lambda/8 < d < \lambda/4$. However, when each electrode width of the positive and negative electrodes is set to $\lambda/8$, since the center distance between the positive and negative electrodes is $\lambda/2$, the range in which each floating electrode can be formed becomes $3\lambda/8$. In this instance, if the spaces between the floating and positive electrodes and between the floating and negative electrodes are taken into consideration, each allowance of the floating electrode displacement from the center position between the positive and negative electrodes is too small so that a sufficient asymmetrical construction cannot be achieved. Because the space in which the floating electrode can be displaced from the intermediate position between the positive and negative electrodes is too small, and the effect of the asymmetrical construction cannot be fully utilized, it is difficult to achieve the loss characteristic and phase characteristic satisfying customers' specification standard when known transducer structure, as it is, is applied to the substrate which comprises quartz or the like piezoelectric material.

In contrast to the above, in the transducer disclosed in JP-A-3-133209, as mentioned above, the electrode width of the positive and negative electrodes and the floating electrodes is set to $\lambda/12$, and both the short-circuited floating electrodes and the open-type floating electrodes are arranged between the positive and negative electrodes. The electrode fingers of the respective electrodes are spaced from each other with a center distance of $\lambda/6$. This electrode structure provides an arrangement wherein each floating electrode can be sufficiently displaced from the center position between the positive and negative electrodes, making it possible to utilize more positively the effect of asymmetrical construction and to improve further the unidirectivity.

Thus, the inventors further conducted experiments using a prototype of the surface acoustic wave filter device in which the electrode finger width is set to $\lambda/12$ and the unidirectional transducers including both the short-circuited floating electrodes and the open-type floating electrodes are formed on the quartz substrate. As a result, it has been revealed that although a satisfactory temperature characteristic could be achieved, the insertion loss was as high as about 10 dB and hence the insertion loss characteristic of the device has to be further improved.

The inventors thus conducted thorough investigations in further detail of the insertion loss characteristic, and found that the sign of reflection factor of the floating electrode intensively affects the insertion loss. That is, in the case of the LiNbO$_3$ substrate, the sign of the reflection factor of the short-circuited floating electrode and the sign of the reflection factor of the open-type floating electrode are reversed with each other, and the spacing of the short-circuited floating electrode by $\lambda/6$ from the open-type floating electrode provides dual functions to enhance the unidirectivity of the transducer, i.e., multiplication of the reflection waves in the propagation direction from the input side transducer to the output side transducer by coincidence of the respective phases, on one hand, and cancellation of the reflection waves with each other in a direction opposite to the propagation direction due to the phase difference of the reflection waves, on the other hand. However, in the case of a quartz substrate or the like, the sign of the reflection factor of the short-circuited floating electrode and the sign of the reflection factor of the open-type floating electrode are equal to each other, so that the reflection factors are canceled with each other in the propagation direction of the surface acoustic wave from the input side transducer to the output side transducer, and this results in a difficulty in realizing a satisfactory unidirectivity and improving the insertion loss characteristic. For this reason, the floating electrodes formed on a quartz substrate or the like should comprise either short-circuited floating electrodes or open-type floating electrodes, but not both of them. Moreover, in a filter device including a quartz substrate or the like, the short-circuited floating electrode has a higher reflection factor as compared to the open-type floating electrode. Therefore, in accordance with the present invention, only the short-circuited floating electrodes are formed as the floating electrodes. With such a construction of the present invention, the insertion loss can be suppressed within an extremely low level even when the substrate comprises quartz or the like material having a smaller electromechanical coupling factor. It thus becomes possible to realize a narrow band surface acoustic wave filter device with a lower loss and an improved temperature characteristic.

DESCRIPTION OF THE PREFERRED EMBODIMENTS

Figure 1:
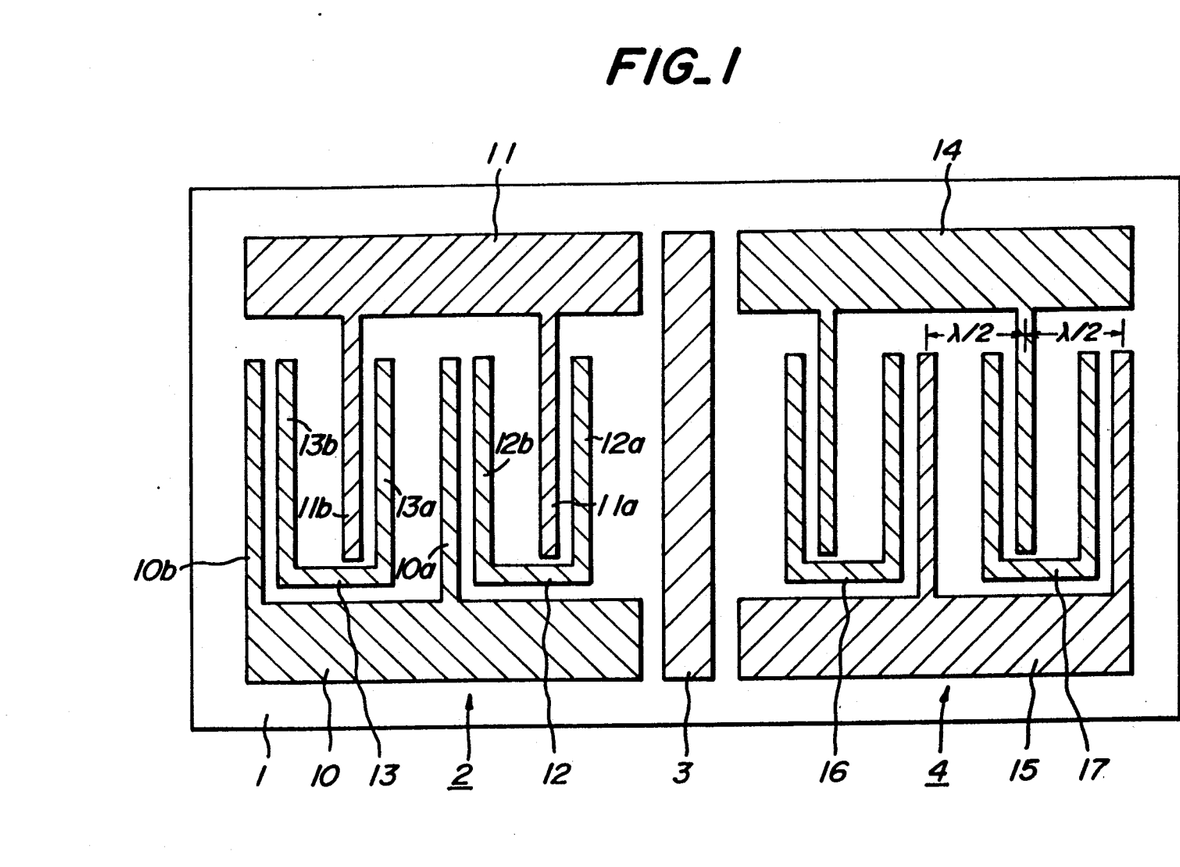
FIG. 1 is a schematic plan view showing one embodiment of the surface acoustic wave filter device according to the invention.

FIG. 1 is a plan view showing the surface acoustic wave filter device according to one embodiment of the invention. An ST-cut quartz substrate 1 is used as a piezoelectric substrate. Such a quartz substrate 1 has a temperature coefficient versus frequency (TCF) which, within a wide temperature range of from $-20°$ C. to $80°$ C., is as small as 1.6 ppm/°C. in contrast to the TCF of $-74$ ppm/°C. for 128° rotated Y-cut, X-propagation LiNbO$_3$. Thus the quartz substrate exhibits a satisfactory temperature characteristic whereby fluctuation of the frequency pass band due to temperature change can be maintained within extremely minute range.

The quartz substrate 1 has a surface which is formed with an input side transducer 2, a shield electrode 3, and an output side transducer 4. According to the present invention, the input side transducer 2 and the output side transducer 4 are constructed as unidirectional transducers, respectively. The substrate material having a smaller electromechanical coupling factor such as quartz provides a lower contribution of the electric perturbed effect. Thus, according to the invention, transducers with asymmetrical construction are used to utilize positively the mechanical reflection on the floating electrode.

More particularly, the input side transducer 2 includes a positive electrode 10 as a first electrode of an interdigital-type, a negative electrode 11 as a second electrode of the same, and short-circuited floating electrodes 12, 13 arranged between these positive and negative electrodes. Similarly, the output side transducer 4 includes a positive electrode 14, a negative electrode 15, and short-circuited floating electrodes 16, 17. In the illustrated embodiment, the width of each electrode finger of these electrodes is set as $\lambda/12$. These electrodes can be formed by photolithography by vapor deposition or sputtering of an aluminum layer on the quartz substrate 1.

For a clear understanding of the basic principle of the present invention and to simplify the illustration in the drawings, two pairs of the respective electrodes are shown in the drawings though various number of pairs can be adapted depending on the desired pass band width, for example, 200 to 400 pairs in the case of narrow band filter devices for digital communication systems. In the illustrated embodiment, the input side transducer 2 and the output side transducer 4 have the same construction, so that the details of the input side transducer will be mainly explained hereinafter.

The spacing between the electrode fingers 10$a$, 10$b$ of the positive electrode 10 and the spacing between the electrode fingers 11$a$, 11$b$ of the negative electrode 11 are set to be equal to the wavelength $\lambda$ of the fundamental surface acoustic wave. The fundamental acoustic surface wavelength $\lambda$ is set to $\lambda = v/f_0$, where "v" represents the propagation speed of the surface acoustic wave in the quartz substrate and $f_0$ represents the center frequency. The center distance between the electrode finger 10$a$, 10$b$ of the positive electrode 10 and the adjacent electrode finger 11$a$, 11$b$ of the negative electrode 11 is set to be $\lambda/2$. The floating electrodes 12, 13 include respective pairs of the electrode fingers 12$a$, 12$b$; 13$a$, 13$b$, and the spacing between these electrode fingers is set to $\lambda/2$. The electrode finger 12$a$ on one side of the floating electrode 12 is adjacent to the electrode finger 11$a$ of the negative electrode 11 on the side of the output side transducer (right side in FIG. 1) with a center distance of $\lambda/6$ therebetween, and the electrode finger 12$b$ on the other side of the floating electrode 12 is adjacent to the electrode finger 10$a$ of the positive electrode 10 on the side of the output side transducer with a center distance of $\lambda/6$ therebetween. Similarly, the electrode finger 13$a$ on one side of the floating electrode 13 is adjacent to the electrode finger 11$b$ of the negative electrode 11 having a center distance therewith of $\lambda/6$ on the side of the output side transducer, and the electrode finger 13$b$ on the other side of the floating electrode 13 is adjacent to the electrode finger 10$b$ of the positive electrode 10 on the side of the output side transducer with a center distance of $\lambda/6$ therebetween.

With such an arrangement of the electrodes, the electrode fingers 12$a$, 12$b$, 13$a$, 13$b$ of the floating electrodes 12, 13 are spaced by a distance of $\lambda/12$ in a direction opposite to the propagation direction of the surface acoustic wave, from each intermediate point between the electrode finger of the positive electrode and the adjacent electrode finger of the negative electrode, so that it is possible to utilize effectively the mechanical reflection characteristic by the floating electrode based on the asymmetric construction, whereby a majority of the surface acoustic wave which has been excited can be propagated toward the right-side in FIG. 1, i.e., to the output side transducer. Consequently, the unidirectivity of the transducer is more improved and enhanced to lower the insertion loss.

In the case of a quartz substrate, it has been found that the displacement from the intermediate point between the electrode finger of the positive electrode and the adjacent electrode finger of the negative electrode of the floating electrode plays an extremely important role in improving the unidirectivity, and an insufficient displacement amount tends to result in an unacceptable insertion loss. As a result of the inventors' studies on influences of such displacement amount, it has been found that, when the electrode fingers of the floating electrodes are partly situated at the mid-point between the positive electrode and the negative electrode, then it is extremely difficult or almost impossible to achieve a satisfactory loss characteristic due to an insufficient displacement amount.

Therefore, in accordance with the present invention, each electrode finger of the floating electrodes of the input side transducer has an edge on its propagation direction-side of the surface acoustic wave, and the edge is spaced from the intermediate position between the electrode finger of an adjacent positive electrode and the electrode finger of an adjacent negative electrode, in a direction which is opposite to the propagation direction of the surface acoustic wave. Similarly, each electrode finger of the floating electrodes of the output side transducer has an edge on its side opposite to the propagation direction of the surface acoustic wave, and the edge is spaced from the intermediate position between the electrode finger of an adjacent positive electrode and the electrode finger of an adjacent negative electrode, in the propagation direction of the surface acoustic wave.

Moreover, as a result of further considerations, when the center position of the electrode fingers of the floating electrode as observed in the propagation direction of the surface acoustic wave is spaced from the intermediate position between the positive electrode and the adjacent negative electrode, by a distance which is substantially equal to the width of the electrode finger, it is possible to match the phases with each other between the reflected wave by the floating electrode and the acoustic surface wave excited by both the positive electrode and the negative electrode, to provide an optimum loss characteristic and an optimum phase characteristic.

Figure 2:
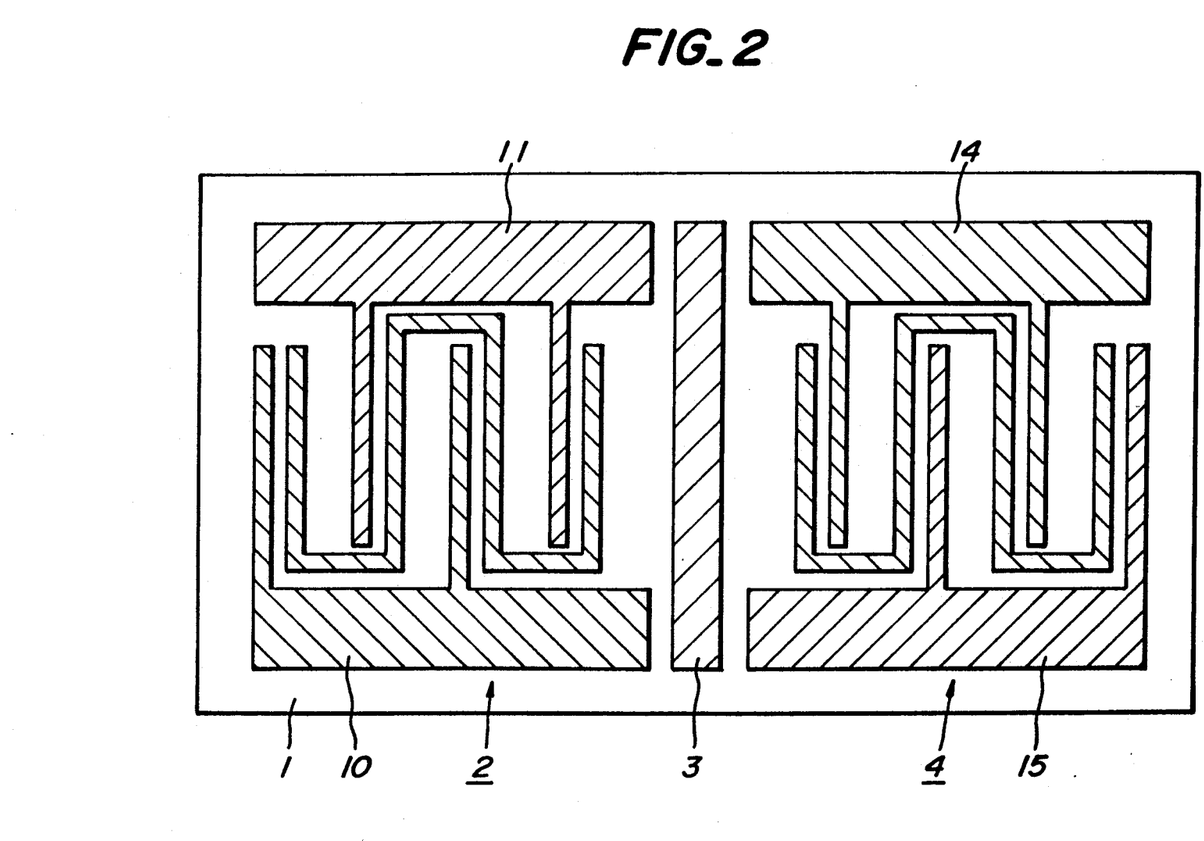
FIG. 2 is a schematic plan view showing a modified embodiment of the surface acoustic wave filter device according to the invention.

FIG. 2 is a plan view showing a modified embodiment of the surface acoustic wave filter device according to the invention. Same symbols and reference numerals are used to denote elements which are structurally or functionally same as those shown in FIG. 1. This embodiment differs from the previous one in that the short-circuited electrodes 12, 13 shown in FIG. 1 are connected with each other on the substrate 1 and used as single floating electrode as a whole. Even with this arrangement, same functional effects can be obtained as in the surface acoustic wave filter device with the construction shown in FIG. 1.

Figure 3:
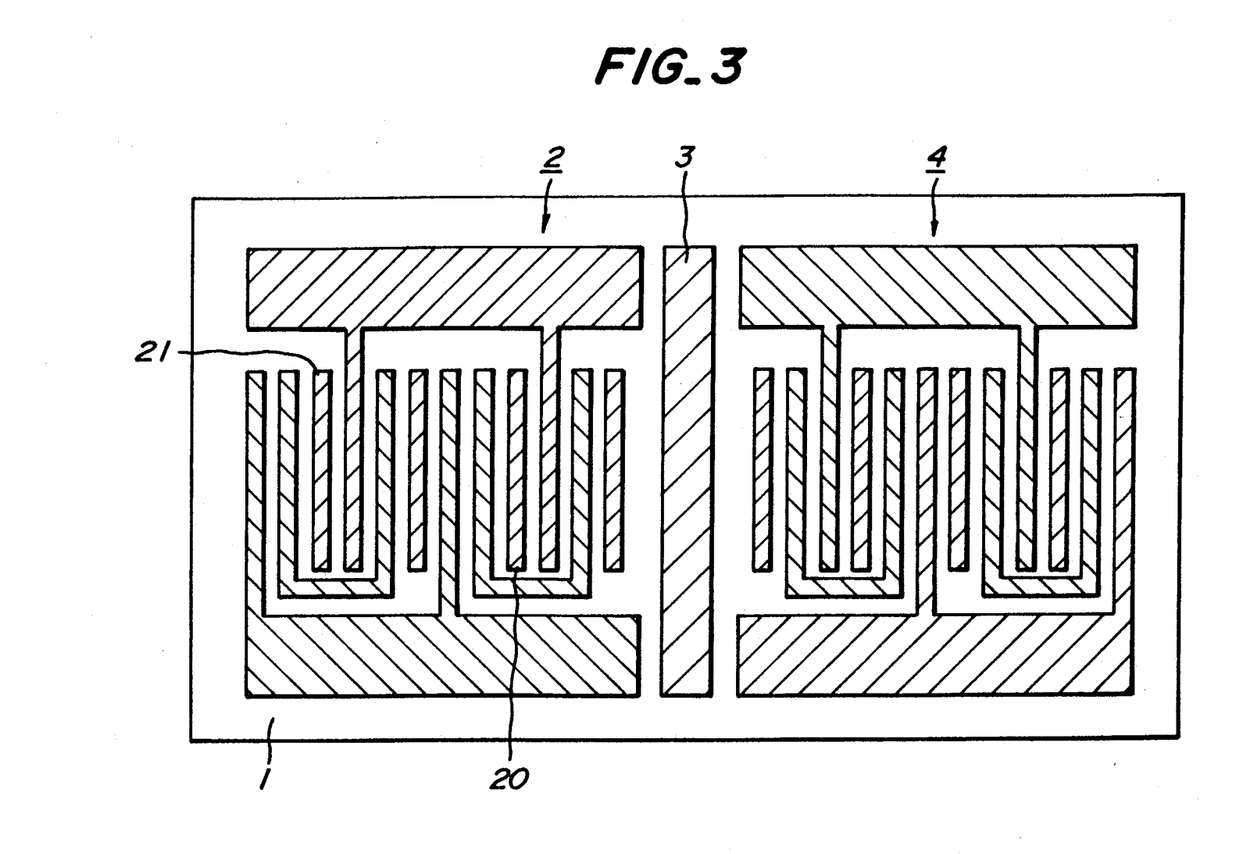
FIG. 3 is a schematic plan view showing a conventional unidirectional transducer prepared as a comparative example.

Next, experimental results will be described for the insertion loss. First of all, for the purpose of comparison experiment, characteristic evaluation was performed for a unidirectional transducer of the present invention with the construction shown in FIG. 1 and for a comparative unidirectional transducer of a construction shown in FIG. 3, each being formed on a quartz substrate. The transducer in FIG. 3 has been prepared by modifying the transducer shown in FIG. 1 to further incorporate open-type floating electrodes 20, 21 having the electrode width of $\lambda/12$ and arranged between the negative electrodes 11a, 11b and the electrode fingers 12b, 13b, so that both the short-circuited floating electrode and the open-type floating electrode are allowed to coexist. Other than the above, both unidirectional transducers are set to the same conditions. These prototypes are set respectively to a center frequency $f_0 = 150$ MHz, and the result of characteristic evaluation test is shown in FIG. 4.

Figure 4:
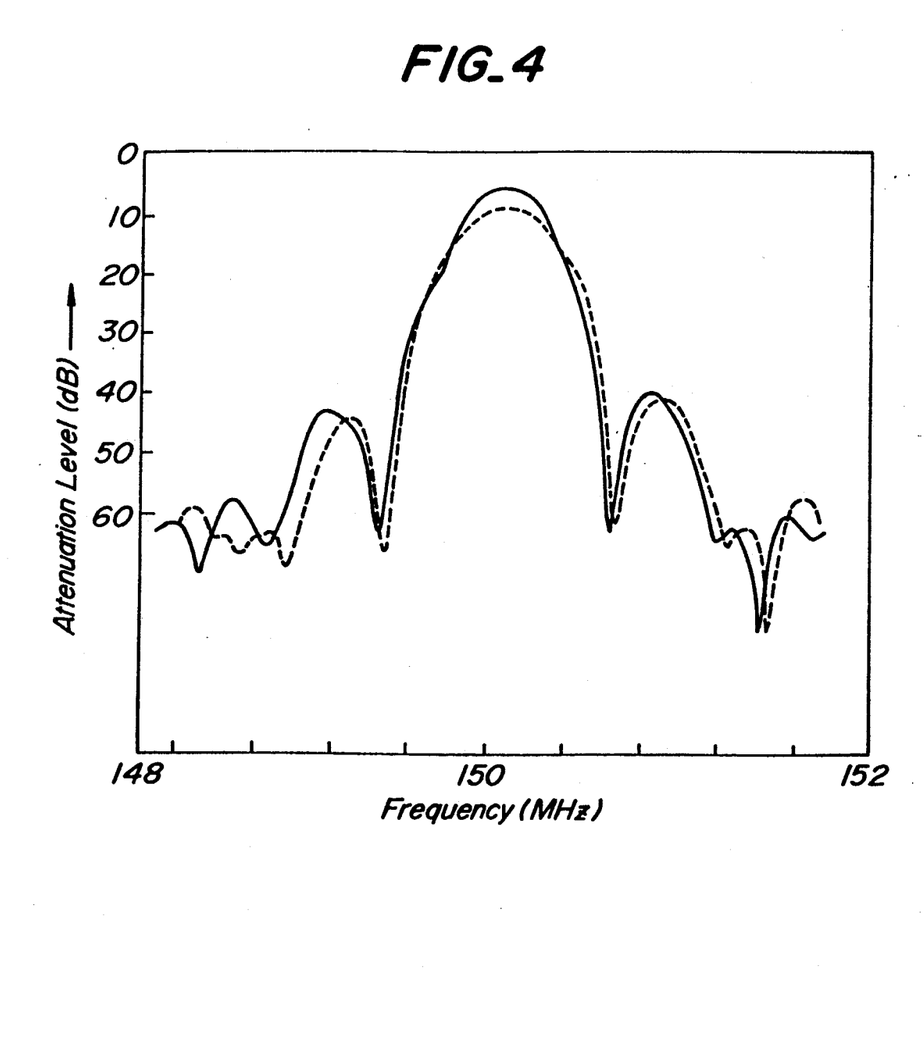
FIG. 4 is a graphical representation showing the frequency characteristic of the surface acoustic wave filter device according to the invention and that of the conventional surface acoustic wave filter device.

In FIG. 4, the abscissa expresses the frequency, and the ordinate expresses the insertion loss. It is clear from FIG. 4 that the surface acoustic wave filter device according to the invention and shown in FIG. 1 has an insertion loss of 5.0 dB, while the comparative filter device shown in FIG. 3 has an insertion loss of 9.8 dB, so that the invention serves to lower the loss by 4.8 dB. As a result of this experimentation, in the case of the quartz substrate having a smaller electromechanical coupling factor, it is clear that the construction of the unidirectional transducer with only the short-circuited floating electrodes is capable of lowering the insertion loss as compared to the construction wherein the short-circuited floating electrodes and the open-type floating electrodes are allowed to coexist. Moreover, the insertion loss of 6.0 dB or more, as is the case for the prior art unidirectional transducer which has been simply applied to the quartz substrate, cannot practically satisfy the requirement of customers' specification. In contrast, the arrangement according to the present invention using only the short-circuited floating electrodes between the positive and negative electrodes serves to lower the insertion loss by about 4.8 dB, to satisfactorily meet the customers' specification.

Next, explanation will be made for the electrode width of the respective electrodes, i.e. the width in the propagation direction of the surface acoustic wave with respect to the electrode fingers. A main factor of the insertion loss is considered to include a loss due to propagation of the acoustic surface wave, a loss due to electric resistance of the electrodes, and a return loss by mis-matching of the electric circuits. The return loss among these can be improved by performing electrical matching in the electric circuits. The loss by propagation of the acoustic surface wave is one which is inherent to the surface acoustic wave filter device, so that the inventors studied on the relationship between the insertion loss and the electric resistance in the electrode. It is conceivable that the electric resistance in the electrode has a significant relationship with the electrode width of the positive and negative electrodes, and a smaller width of the electrode increases the electric resistance and the insertion loss. It is also conceivable that, as regards the relationship between the electrode width and the reflection efficiency or exciting efficiency, a smaller width of the electrode decreases the reflection factor and the exciting efficiency.

Figure 5:
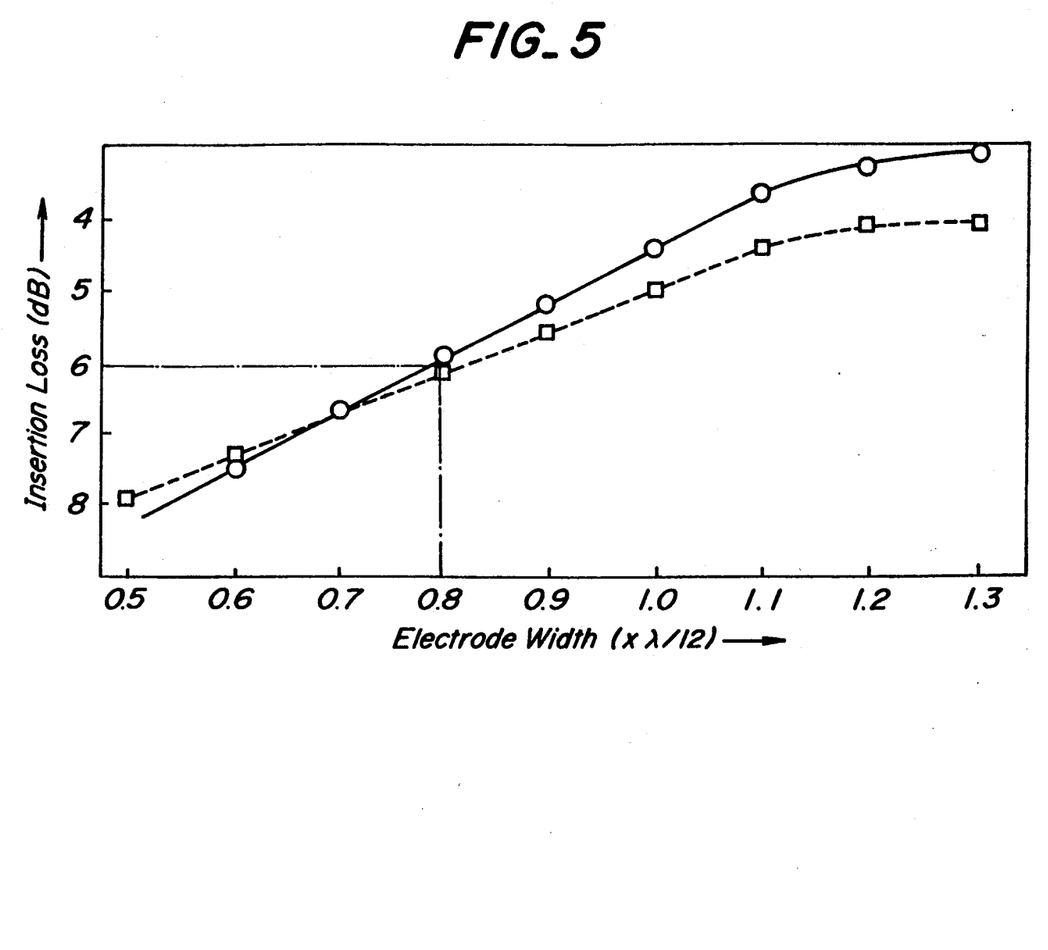
FIG. 5 is a graphical representation showing the relationship between the electrode width and the insertion loss of the surface acoustic wave filter device according to the invention.

FIG. 5 is a graphical representation of the experimental result showing the relationship between the electrode width and the insertion loss. In this experiment, as the surface acoustic wave filter device in which the unidirectional transducers shown in FIG. 1 are formed on the quartz substrate, two types of filter devices were prepared, which are different in the aperture length, one having the aperture length of $40\lambda$ and another having the aperture length of $100\lambda$. It should be noted that the aperture length is the length with which the electrodes of the positive and negative electrodes are overlapped with each other as observed in the propagating direction of the acoustic surface wave. As the filter device with the aperture length of 100 Å, a series of filter devices were prepared each having the electrode width which increases at every $0.1 \times \lambda/12$ in a range from $0.5 \times \lambda/12$ to $1.3 \times \lambda/12$, and their characteristics were evaluated. Similarly, as the filter device with the aperture length of 40 Å, a series of filter devices were prepared each having the electrode width which increases at every $0.1 \times \lambda/12$ within a range from $0.6 \times \lambda/12$ to $1.3 \times \lambda/12$, and their characteristics were evaluated. In FIG. 5, the abscissa expresses the electrode width ($\times \lambda/12$), the ordinate expresses the insertion loss (dB), the solid line expresses the data for the aperture length of 40 λ, and the dotted line expresses the data for the aperture length of 100 λ. It is clear from FIG. 5 that, for both types of the filter device, i.e., regardless of the magnitude of the aperture length, the increase in the electrode width results in decreased insertion loss. In order to meet a practical standard for the insertion loss of 6 dB or less, the electrode width should be $0.8 \times \lambda/12$ or more.

Figure 6:
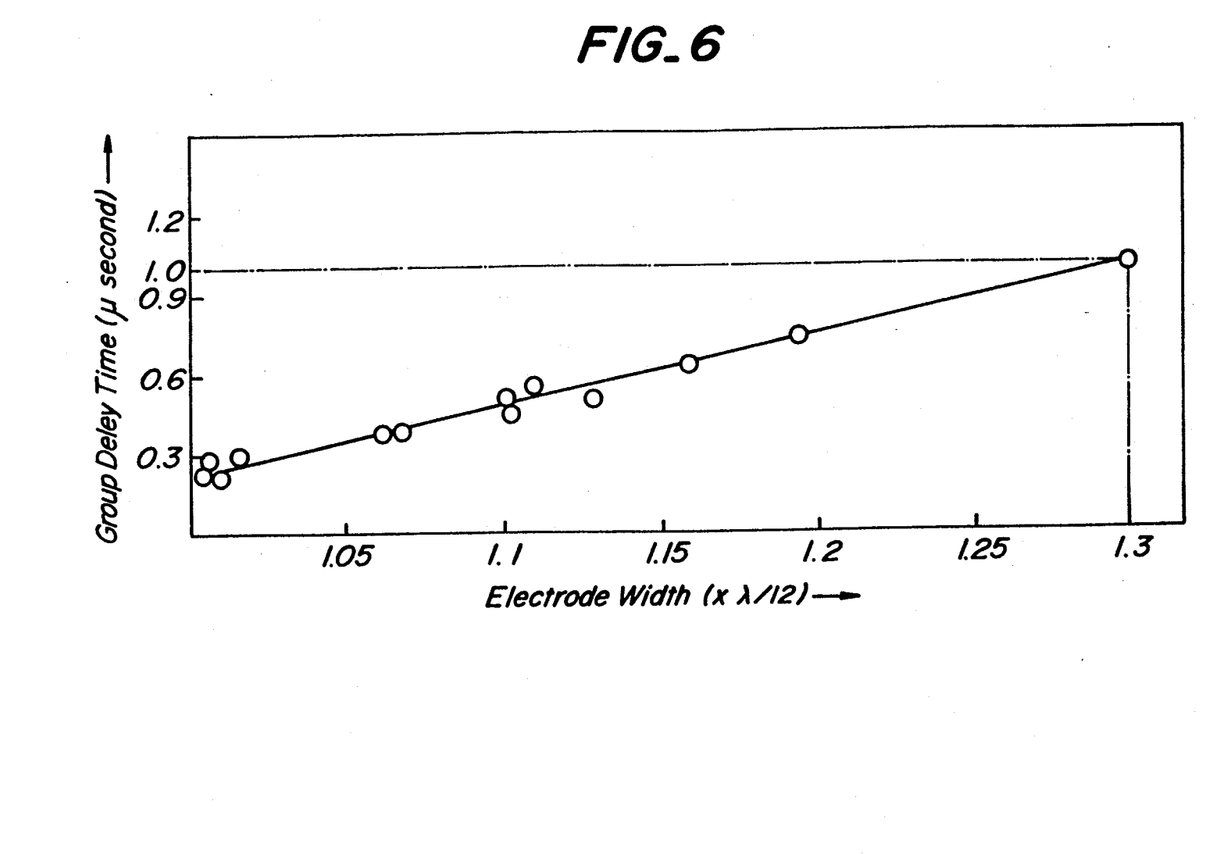
FIG. 6 is a graphical representation showing the relationship between the electrode width and GDT of the surface acoustic wave filter device according to the invention.

On the other hand, a larger electrode width often results in increased group delay time (GDT) and increased wave distortion in the frequency characteristic. For this reason, the relationship between the electrode width and GDT has been considered. FIG. 6 shows the experimental result of the relationship between the electrode width ($\times \lambda/12$) and GDT ($\mu$ second), wherein the abscissa represents the electrode width ($\times \lambda/12$) and the ordinate represents GDT ($\mu$ second). It is clear that a larger electrode width results in increases in the GDT. In order to meet a practical customers' specification standard of GDT of $1.0$ $\mu$ second or less, the electrode width should be $1.3 \times \lambda/12$ or less.

Based on considerations for the insertion loss and GDT, it has been clarified that the surface acoustic wave filter device including unidirectional transducers of asymmetrical arrangement formed on the quartz substrate exhibits a tendency that a large electrode width results in increased GDT while a small electrode width adversely affects the insertion loss. Therefore, in view of the experimental results and the customers' specification standard, it is highly desirable for the electrode width "d" to be set to satisfy the condition $0.8 \times \lambda/12 \leq d \leq 1.3 \times \lambda/12$.

The present invention is not limited to the specific embodiments as hereinbefore described, and it is understood that the foregoing and the other modifications and changes can be made therein without departing from the scope as defined in the appended claims. For example, in the embodiment described above, the quartz substrate has been used as a piezoelectric substrate, though the present invention can be applied to substrate materials having a small electromechanical coupling factor which is substantially on the order of the electromechanical coupling factor of quartz, such as $Li_2B_4O_7$.

Furthermore, the present invention can be applied not only to narrow band filters but also to the surface acoustic wave filter devices of various band widths, by suitably setting the number of pairs of transducers depending on the desired pass band width of filters, e.g., to wide band filters used for image circuits, narrow band filters used for communication systems of mobile bodies, and further to filter devices for digital communication systems for which significant attention has to be paid to the phase characteristic.

It will be appreciated from the foregoing detailed description that the surface acoustic wave filter device according to the invention includes a piezoelectric substrate having an extremely minute temperature coefficient to frequency (TCF), and the floating electrodes are sufficiently displaced from the intermediate point between the adjacent positive and negative electrodes to utilize more intensively the effect of the asymmetrical construction, and to utilize more effectively the mechanical reflection by the floating electrode. The present invention thus provides an improved surface acoustic wave filter device which is capable of exhibiting a satisfactory phase characteristic with a low insertion loss and which is less sensitive to temperature change. Moreover, the electrode width can be suitably set so as to realize the surface acoustic wave filter device which is capable of satisfying the customers' specification standard in both insertion loss and GDT.

What is claimed is:

1. A surface acoustic wave filter device comprising:
   a substrate comprising a piezoelectric material and having a surface; an interdigital-type input side transducer applied on said surface of the substrate and including an input side positive electrode having a plurality of electrode fingers, an input side negative electrode having a plurality of electrode fingers each arranged between successive electrode fingers of said input side positive electrode, and an input side floating electrode having a plurality of electrode fingers arranged between successive electrode fingers of said input side negative and positive electrodes; an interdigital-type output side transducer applied on said surface of the substrate and including an output side positive electrode having a plurality of electrode fingers, an output side negative electrode having a plurality of electrode fingers each arranged between successive electrode fingers of said output side positive electrode, and an output side floating electrode having a plurality of electrode fingers arranged between successive electrode fingers of said output side negative and positive electrode, said electrode fingers of positive and negative electrodes of each of said input side and output side transducers being spaced from each other by a center distance of $\lambda/2$ in a propagation direction of a surface acoustic wave which propagates on said surface of the substrate, wherein $\lambda$ is a wavelength of a fundamental surface acoustic wave, and;

said piezoelectric material of the substrate comprises quartz or a material having an electromechanical coupling factor which is substantially on the same order as that of quartz;

said floating electrodes of said input side and output side transducers are short-circuited floating electrodes;

each electrode finger of said positive electrodes, negative electrodes and floating electrodes of said input side and output side transducers has a width "d" as defined in the propagation direction of the surface acoustic wave, said width "d" satisfying a condition $0.8 \times \lambda/12 \leq d \leq 1.3 \times \lambda/12$;

each electrode finger of the floating electrode of the input side transducer has an edge on its propagation direction-side of the surface acoustic wave, said edge being spaced from an intermediate position between an adjacent electrode finger of the positive electrode and an adjacent electrode finger of the negative electrode, in a direction which is opposite to the propagation direction of the surface acoustic wave; and each electrode finger of the floating electrode of the output side transducer has an edge on its side opposite to the propagation direction of the surface acoustic wave, said edge being spaced from an intermediate position between an adjacent electrode finger of the positive electrode and an adjacent electrode finger of the negative electrode, in the propagation direction of the surface acoustic wave.

2. The surface acoustic wave filter device according to claim 1, wherein each electrode finger of the floating electrode of the input side transducer is spaced from the intermediate position between an adjacent electrode finger of the positive electrode and an adjacent electrode finger of the negative electrode, by a distance $\lambda/12$.

3. The surface acoustic wave filter device according to claim 1, wherein each electrode finger of the floating electrode of the output side transducer is spaced from the intermediate position between an adjacent electrode finger of the positive electrode and an adjacent electrode finger of the negative electrode, by a distance $\lambda/12$.

4. The surface acoustic wave filter device according to claim 1, wherein each electrode finger of the floating electrode of each of said input and output side transducers is spaced from the intermediate position between an adjacent electrode finger of the positive electrode and an adjacent electrode finger of the negative electrode, by a distance $\lambda/12$.

5. The surface acoustic wave filter device according to claim 1, wherein each of said electrode fingers of the positive electrode, negative electrode and floating electrode of said input side transducer has a width "d" of $\lambda/12$.

6. The surface acoustic wave filter device according to claim 1, wherein each of said electrode fingers of the positive electrode, negative electrode and floating electrode of said output side transducer has a width "d" of $\lambda/12$.

7. The surface acoustic wave filter device according to claim 1, wherein each of said electrode fingers of the positive electrode, negative electrode and floating electrode of each of said input and output side transducers has a width "d" of $\lambda/12$.

8. The surface acoustic wave filter device according to claim 1, wherein each electrode finger of the floating electrode of each of the input and output side transducers is spaced from the intermediate position between an adjacent electrode finger of the positive electrode and an adjacent electrode finger of the negative electrode, by a distance $\lambda/12$, and wherein each of said electrode fingers of the positive electrode, negative electrode and floating electrode of each of said input and output side transducers has width "d" of $\lambda/12$.

9. The surface acoustic wave filter device according to claim 1, wherein said substrate comprises $Li_2B_4O_7$.

* * * * *